(12) United States Patent
Kim

(10) Patent No.: US 9,775,248 B2
(45) Date of Patent: Sep. 26, 2017

(54) DISPLAY DEVICE

(71) Applicant: SAMSUNG DISPLAY CO., LTD., Yongin, Gyeonggi-Do (KR)

(72) Inventor: Dong-Ho Kim, Seoul (KR)

(73) Assignee: SAMSUNG DISPLAY CO., LTD., Yongin-Si, Gyeonggi-Do (KR)

(*) Notice: Subject to any disclaimer, the term of this patent is extended or adjusted under 35 U.S.C. 154(b) by 2 days.

(21) Appl. No.: 14/862,549

(22) Filed: Sep. 23, 2015

(65) Prior Publication Data

US 2016/0242295 A1 Aug. 18, 2016

(30) Foreign Application Priority Data

Feb. 17, 2015 (KR) ........................ 10-2015-0024471

(51) Int. Cl.
| | |
|---|---|
| H05K 1/00 | (2006.01) |
| H05K 1/18 | (2006.01) |
| H05K 1/14 | (2006.01) |
| H05K 1/11 | (2006.01) |
| H01L 27/32 | (2006.01) |

(52) U.S. Cl.
CPC ......... H05K 1/189 (2013.01); H01L 27/3276 (2013.01); H05K 1/111 (2013.01); H05K 1/147 (2013.01); H05K 2201/09409 (2013.01); H05K 2201/09418 (2013.01); H05K 2201/10128 (2013.01)

(58) Field of Classification Search
USPC ........................... 361/749, 748, 301
See application file for complete search history.

(56) References Cited

U.S. PATENT DOCUMENTS

| | | | |
|---|---|---|---|
| 5,708,297 A * | 1/1998 | Clayton ................. | H01L 23/13 257/712 |
| 8,536,458 B1 | 9/2013 | Darveaux et al. | |
| 2014/0131889 A1* | 5/2014 | Kim .................. | H01L 23/49838 257/774 |

FOREIGN PATENT DOCUMENTS

| | | |
|---|---|---|
| KR | 10-2008-0085443 A | 9/2008 |
| KR | 10-1009976 | 1/2011 |
| KR | 10-2014-0013210 A | 2/2014 |

* cited by examiner

Primary Examiner — Andargie M Aychillhum
(74) Attorney, Agent, or Firm — Lee & Morse, P.C.

(57) ABSTRACT

A display device including a flexible circuit board including an insulation film, the insulation film including an input pad part and an output pad part on a first side thereof; a printed circuit board including a first pad part, the first pad part being connected to the input pad part; and a display panel including a second pad part, the second pad part being connected to the output pad part, wherein the input pad part includes a plurality of input pads that are arranged in at least two pad columns, and the flexible circuit board includes a plurality of dummy layers aligned with the plurality of input pads on a second side of the insulation film, the second side being an opposite side to the first side.

14 Claims, 16 Drawing Sheets

DISPLAY DEVICE

CROSS-REFERENCE TO RELATED APPLICATION

Korean Patent Application No. 10-2015-0024471, filed on Feb. 17, 2015, in the Korean Intellectual Property Office, and entitled: "Display Device," is incorporated by reference herein in its entirety.

BACKGROUND

1. Field

Embodiments relate to a display device.

2. Description of the Related Art

A flat panel display (e.g., a liquid crystal display or an organic light emitting diode display) may include a display panel including a plurality of pixels, a flexible circuit board fixed to a pad area of the display panel, and a printed circuit board (PCB) coupled to the flexible circuit board. The flexible circuit board may be configured by a chip on film.

The chip on film is a kind of semiconductor chip package in which a driving chip is mounted on a polymer film engraved with a circuit and may be foldable or rollable due to flexibility of a material. The driving chip may serve as a scan driver or a data driver. A pad part of the PCB may be connected with an input pad part of the flexible circuit board, and the PCB outputs a control signal to the driving chip.

The coupling of the PCB and the flexible circuit board may be performed by disposing an anisotropic conductive film (ACF) and the input pad part of the flexible circuit board on the pad part of the PCB and pressing the input pad part of the flexible circuit board by hot press equipment. Then, conductive balls included in the ACF contact the pad part of the PCB and the input pad of the flexible circuit board to conduct the pad part of the PCB and the input pad of the flexible circuit board.

The above information disclosed in this Background section is only for enhancement of understanding of the background of the disclosure and therefore it may contain information that does not form the prior art that is already known in this country to a person of ordinary skill in the art.

SUMMARY

Embodiments are directed to a display device.

The embodiments may be realized by providing a display device including a flexible circuit board including an insulation film, the insulation film including an input pad part and an output pad part on a first side thereof; a printed circuit board including a first pad part, the first pad part being connected to the input pad part; and a display panel including a second pad part, the second pad part being connected to the output pad part, wherein the input pad part includes a plurality of input pads that are arranged in at least two pad columns, and the flexible circuit board includes a plurality of dummy layers aligned with the plurality of input pads on a second side of the insulation film, the second side being an opposite side to the first side.

The plurality of dummy layers may overlap with the plurality of input pads, respectively, and may have the same size as the plurality of input pads.

The plurality of dummy layers may be made of metal.

The plurality of dummy layers may be made of a solder resist.

The at least two pad columns may include a first pad column and a second pad column, and the second pad column may be aligned with the first pad column.

The at least two pad columns may include a first pad column and a second pad column, and the second pad column may be offset relative from the first pad column at one side of the first pad column.

In the first pad column, the plurality of input pads may directly contact a corresponding input wiring, and in the second pad column, the plurality of input pads may be connected with the corresponding input wiring through a connection wiring on a second side of the insulation film.

Dummy layers of the plurality of dummy layers that are aligned with the second pad column may be integrally formed with the connection wiring.

The at least two pad columns may include a first pad column and a second pad column, dummy layers of the plurality of dummy layers that are aligned with the first pad column may be covered by a first solder resist layer, and dummy layers of the plurality of dummy layers that are aligned with the second pad column may be covered by a second solder resist layer.

The embodiments may be realized by providing a display device including a flexible circuit board including an insulation film, the insulation film including an input pad part and an output pad part on a first side thereof; a printed circuit board including a first film, a first metal layer, a second film, and a second metal layer sequentially laminated on the first film, the printed circuit board including a first pad part in which a part of the second metal layer is connected to the input pad part; and a display panel including a second pad part, the second pad part being connected to the output pad part, wherein the input pad part includes a plurality of input pads that are arranged in at least two pad columns, and the first metal layer includes a first opening therein, the first opening being aligned with a space between the at least two pad columns.

The first film may include a second opening therein, the second opening being aligned with a space between the at least two pad columns.

The at least two pad columns may include a first pad column and a second pad column, and the second pad column may be aligned with the first pad column.

The at least two pad columns may include a first pad column and a second pad column, and the second pad column may be offset relative to the first pad column at one side of the first pad column.

The least two pad columns may include a first pad column and a second pad column, the flexible circuit board may include a first solder resist layer and a second solder resist layer on a second side of the insulation film, the second side being an opposite side to the first side, and the first solder resist layer and the second solder resist layer may overlie the first pad column and the second pad column.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
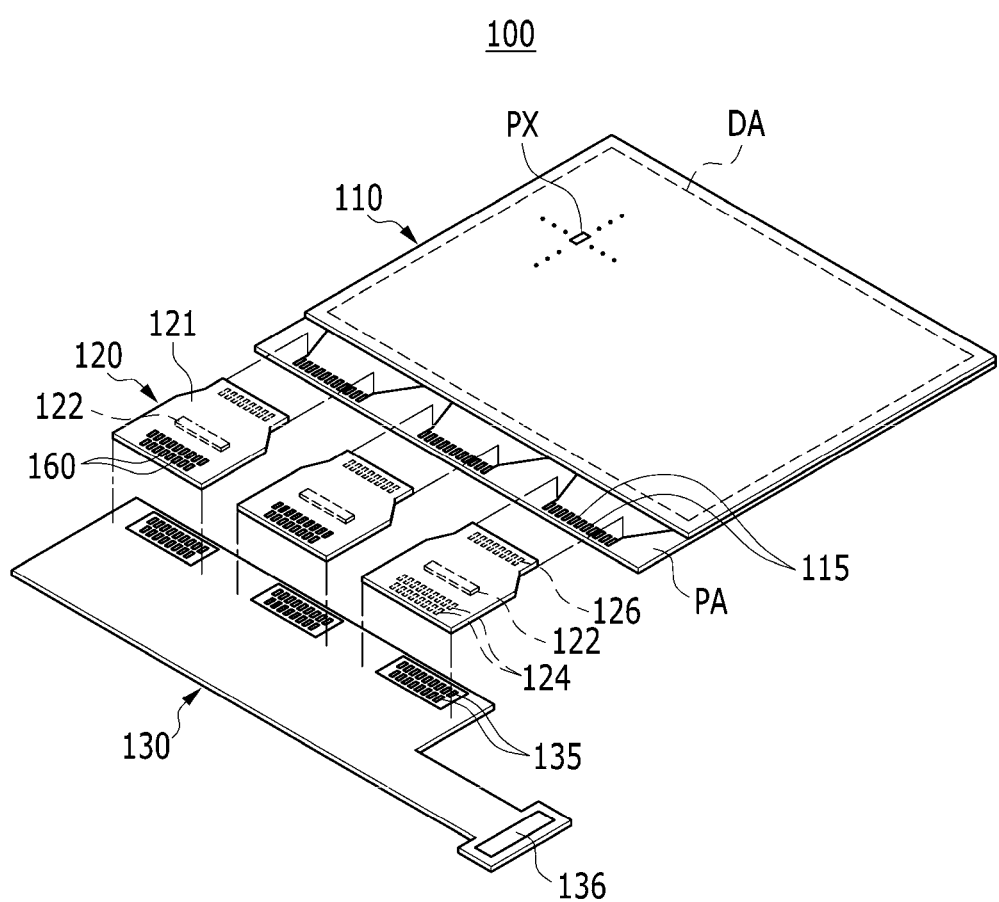
FIG. 1 illustrates an exploded perspective view of a display device according to a first exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will be understood that when an element such as a layer, film, region, or substrate is referred to as being "on" another element, it can be directly on the other element or intervening elements may also be present. Further, in the specification, the word "on" means positioning on or below the object portion, but does not essentially mean positioning on the upper side of the object portion based on a gravity direction.

In addition, unless explicitly described to the contrary, the word "comprise" and "include", and variations such as "includes," "comprises," or "comprising", will be understood to imply the inclusion of stated elements but not the exclusion of any other elements.

Figure 2:
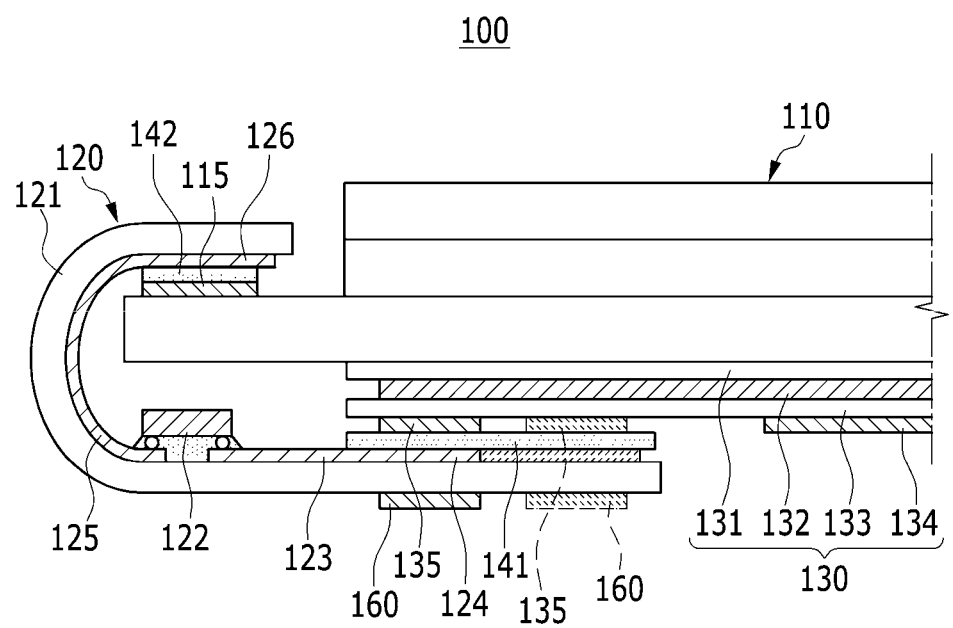
FIG. 2 illustrates a partial cross-sectional view of an assembled state of the display device of FIG. 1.

FIG. 1 illustrates an exploded perspective view of a display device according to a first exemplary embodiment. FIG. 2 illustrates a partial cross-sectional view of an assembled state of the display device illustrated in FIG. 1.

Referring to FIGS. 1 and 2, a display device 100 of a first exemplary embodiment may include a display panel 110, a flexible circuit board 120, and a printed circuit board 130. The display panel 110 may be, e.g., any one of a liquid crystal panel, an organic light emitting panel, and an electrophoretic panel. In an implementation, a touch screen panel, a polarization film, and a cover window may be laminated on the display panel 110.

The display panel 110 may include a display area DA and a pad area PA (outside the display area). In the display area DA, a plurality of signal lines including a scan line, a data line, and the like and a plurality of pixels PX connected to the plurality of signal lines may be formed.

In the case of the organic light emitting panel, the plurality of signal lines may include a scan line, a data line, and a driving voltage line. In addition, each of the plurality of pixels PX may include at least two thin film transistors (a switching thin film transistor and a driving thin film transistor), and at least one storage capacitor.

The flexible circuit board 120 may be configured by a chip on film (COF), e.g., may have a COF structure. For example, the flexible circuit board 120 may include an insulation film 121, a driving chip 122 mounted on the insulation film 121, an input pad part 124 electrically connected with the driving chip 122 through an input wiring 123, and an output pad part 126 connected with the driving chip 122 through an output wiring 125.

The insulation film 121 may be, e.g., a polyimide film. The driving chip 122 may be mounted on the insulation film 121 by using, e.g., an anisotropic conductive film, a solder bump, or the like. The input wiring 123 may connect the input pad part 124 and an input terminal of the driving chip 122. The output wiring 125 may connect an output terminal of the driving chip 122 and the output pad part 126. In an implementation, the input wiring 123 and the output wiring 125 may be covered and protected by a solder resist.

The driving chip 122 may serve as a scan driver that outputs a scan signal to the scan line of the display panel 110 or may serve as a data driver that outputs a data signal to the data line of the display panel 110. In the flexible circuit board 120, the input pad part 124, the input wiring 123, the driving chip 122, the output wiring 125, and the output pad part 126 may be formed on one, e.g., same, side (first side) of the insulation film 121.

The printed circuit board 130 may have a multi-layered film structure. For example, the printed circuit board 130 may include a first film 131, a first metal layer 132 formed on the first film 131, a second film 133 covering the first metal layer 132, and a second metal layer 134 formed on the second film 133.

The first film 131 and the second film 133 may be, e.g., polyimide films. A part of the second metal layer 134 may configure or form a first pad part 135 that is connected to the input pad part 124 of the flexible circuit board 120. The printed circuit board 130 may include a connector 136 to receive an external signal, and electronic devices for signal processing, and may output a control signal to the driving chip 122 of the flexible circuit board 120.

The display panel 110 may include a second pad part 115 in the pad area PA. The output pad part 126 of the flexible circuit board 120 may be connected to the second pad part 115. The second pad part 115 may be electrically connected to the plurality of signal lines in the display area DA.

The first pad part 135 of the printed circuit board 130 may be coupled with the input pad part 124 of the flexible circuit board 120 by a first anisotropic conductive film 141. The output pad part 126 of the flexible circuit board 120 may be coupled with the second pad part 115 of the display panel 110 by a second anisotropic conductive film 142. Accordingly, a conductive passage connecting the printed circuit board 130, the flexible circuit board 120, and the display panel 110 may be completed.

The flexible circuit board 120 may be curved toward (e.g., bent around) a rear side of the display panel 110 and thus the printed circuit board 130 may face the rear side of the display panel 110. In this case, a dead space outside the display area DA may be minimized.

As a resolution of the display panel 110 is higher, a greater number of wires and pads may be included on the flexible circuit board 120. In order to dispose a greater number of pads in a limited area, each of the input pad part 124 of the flexible circuit board 120 and the first pad part 135 of the printed circuit board 130 may be formed by a configuration in which pads in two columns are arranged in a zigzag or offset form.

Figure 3:
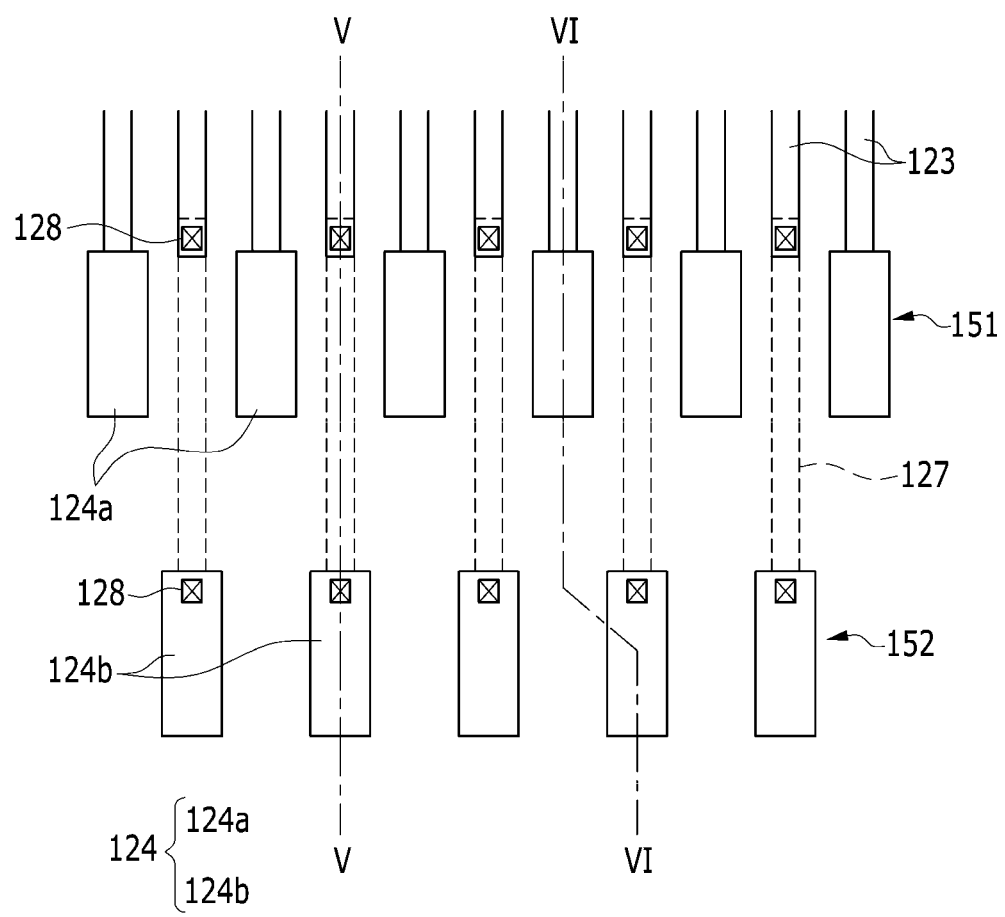
FIG. 3 illustrates a partial plan view of an input pad part of a flexible circuit board in the display device of FIG. 1.
Figure 4:
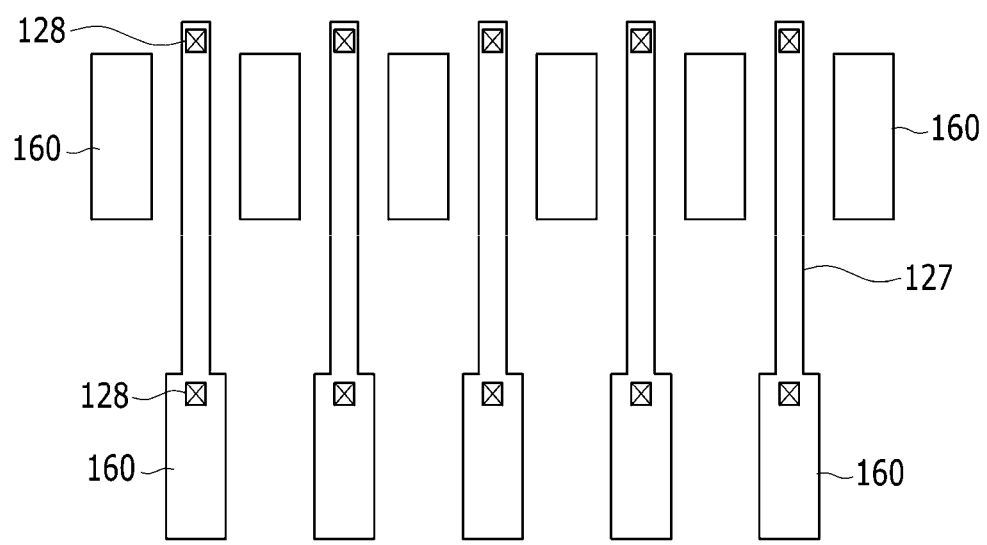
FIG. 4 illustrates a partial plan view of an opposite surface of the input pad part of FIG. 3.
Figure 5:
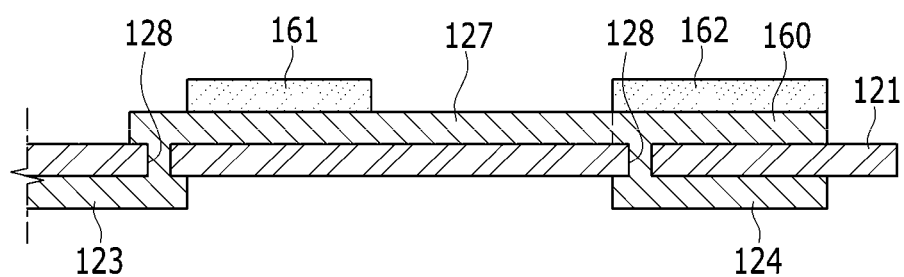
FIG. 5 illustrates a cross-sectional view of the flexible circuit board of FIG. 3 taken along line V-V.
Figure 6:
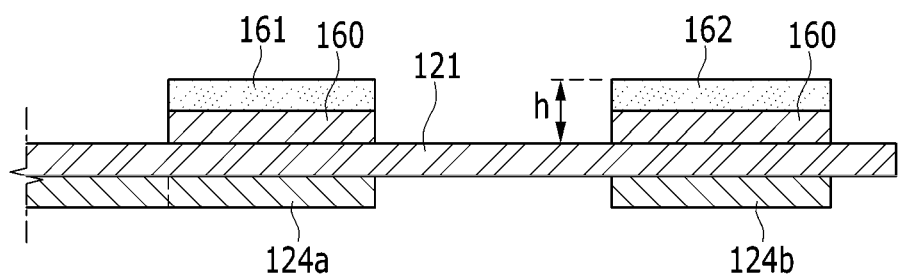
FIG. 6 illustrates a cross-sectional view of the flexible circuit board of FIG. 3 taken along line VI-VI.

FIG. 3 illustrates a partial plan view of an input pad part of a flexible circuit board in the display device illustrated in FIG. 1. FIG. 4 illustrates a partial plan view of an opposite surface of the input pad part illustrated in FIG. 3. For example, FIG. 3 illustrates a first side of the insulation film and FIG. 4 illustrates a second side of the insulation film which is opposite to the first side. FIG. 5 illustrates a cross-sectional view of the flexible circuit board of FIG. 3 taken along line V-V. FIG. 6 illustrates a cross-sectional view of the flexible circuit board of FIG. 3 taken along line VI-VI.

Referring to FIGS. 3 to 6, the input pad part 124 of the flexible circuit board 120 may include a first pad column 151 and a second pad column 152 which include a plurality of input pads 124a and 124b arranged in parallel. The second pad column 152 may be misaligned or offset from the first pad column 151 below or spaced apart from the first pad column 151. For example, the plurality of input pads 124a and 124b may be arranged in a zigzag form.

The plurality of input pads 124a of the first pad column 151 may directly contact the corresponding input wiring 123. The plurality of input pads 124b of the second pad column 152 may be electrically connected or in communication with the corresponding input wiring 123 through a connection wiring 127 that is on the second side of the insulation film 121. The connection wiring 127 may contact the input wiring 123 and the input pad 124b of the second pad column 152 through two via holes 128.

A plurality of dummy layers 160 (overlapping or aligned with the plurality of input pads 124a and 124b) may be formed on the second side of the insulation film 121. The dummy layer 160 may be made of metal and may be the same size as the input pads 124a and 124b (e.g., the dummy layer 160 may have the same size and shape as the input pads 124a and 124b). In an implementation, the dummy layer 160 overlapping or aligned with the input pad 124b of the second pad column 152 may be integrally formed with the connection wiring 127.

A first solder resist layer 161 may be formed on the plurality of dummy layers 160 that overlap or are aligned with the first pad column 151. A second solder resist layer 162 may be formed on the plurality of dummy layers 160 that overlap or are aligned with the second pad column 152. The first and second solder resist layers 161 and 162 may be spaced apart from each other. A space between the first solder resist layer 161 and the second solder resist layer 162 may correspond to a space between the first pad column 151 and the second pad column 152.

The plurality of dummy layers 160 and the first and second solder resist layers 161 and 162 may be formed on the second side of the insulation film 121. As a result, in the flexible circuit board 120, portions corresponding to the first and second pad columns 151 and 152 are higher than a portion corresponding to a space between the first and second pad columns 151 and 152. For example, the portion corresponding to the first and second pad columns 151 and 152 and the portion corresponding to the space between the first and second pad columns 151 and 152 may have a difference in a height of h (see FIG. 6).

The difference in the height may help reduce a spring back effect by minimizing deformation of the insulation film 121 and the first anisotropic conductive film 141 when the input pad part 124 of the flexible circuit board 120 is pressed by a hot pressing apparatus in order to couple the printed circuit board 130 and the flexible circuit board 120 with each other.

Figure 7A:
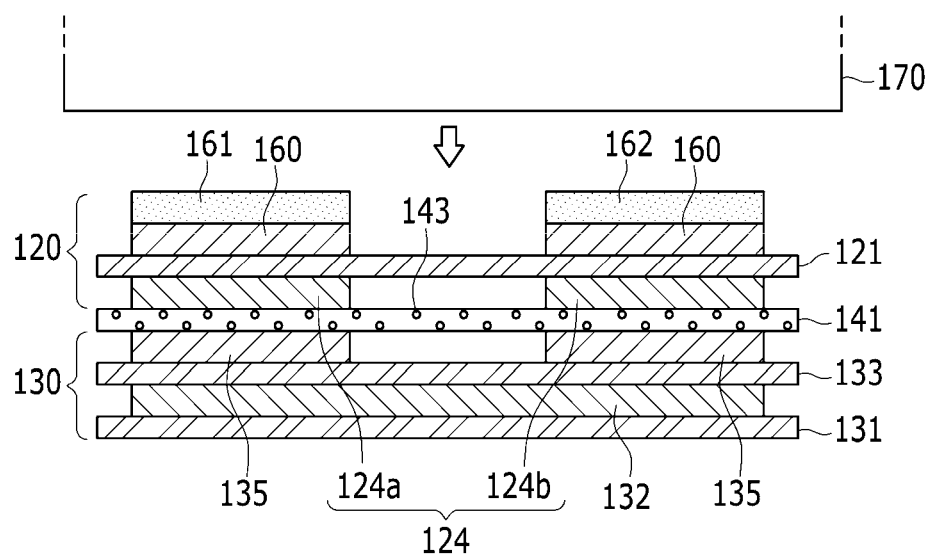
FIGS. 7A and 7B illustrate partial cross-sectional views of a flexible circuit board and a printed circuit board of the display device of FIG. 1.
Figure 7B:
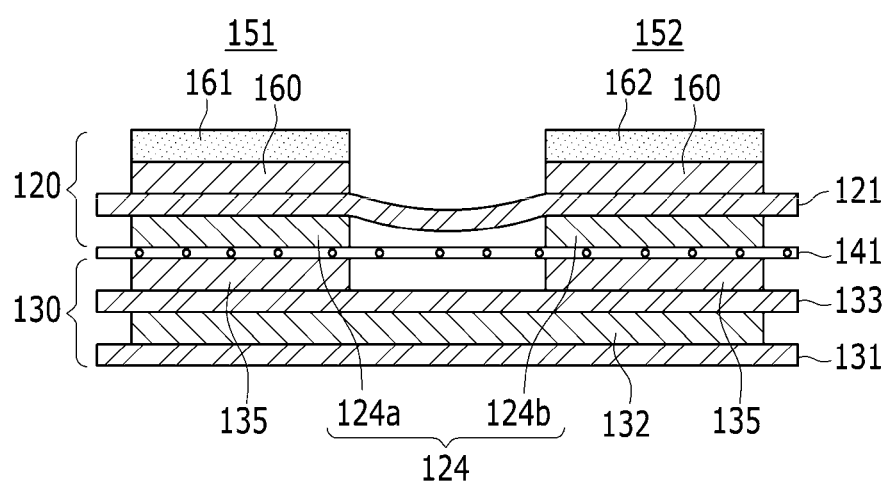

FIGS. 7A and 7B illustrate partial cross-sectional views of a flexible circuit board and a printed circuit board of the display device of FIG. 1.

Referring to FIGS. 7A and 7B, the first anisotropic conductive film 141 and the input pad part 124 of the flexible circuit board 120 may be positioned on the first pad part 135 of the printed circuit board 130. The input pad part 124 may face the first pad part 135, and the plurality of dummy layers 160 overlapping with the plurality of input pads 124a and 124b and the first and second solder resist layers 161 and 162 may be formed on the second side of the insulation film 121.

When the input pad part 124 of the flexible circuit board 120 is pressed by a hot pressing apparatus 170, conductive balls 143 included in the first anisotropic conductive film 141 may contact the first pad part 135 of the printed circuit board 130 and the input pads 124a and 124b of the flexible circuit board 120 to electrically connect the first pad part 135 of the printed circuit board 130 and the input pads 124a and 124b of the flexible circuit board 120. In this process, the pressing apparatus 170 may selectively press only a portion corresponding to the first and second pad columns 151 and 152 by the plurality of dummy layers 160 and the first and second solder resist layers 161 and 162.

For example, the plurality of dummy layers 160 and the first and second solder resist layers 161 and 162 may directly transfer heat and pressure of the pressing apparatus 170 to the first and second pad columns 151 and 152. In contrast, the portion of the flexible circuit board 120 corresponding to the space between the first and second pad columns 151 and 152 may not be pressed by the pressing apparatus 170 due to the height difference h, and even though the portion may be subject to some heat and/or pressure, a deformation degree due to the pressure may be very small (e.g., as illustrated in FIG. 7B), and may not adversely affect the connection or operation of the components.

Accordingly, the first anisotropic conductive film 141 and the flexible circuit board 120 may not be subjected to a spring back effect at the space between the first pad column 151 and the second pad column 152, and the display device 100 of the first exemplary embodiment may help prevent a lifting defect of the flexible circuit board 120.

Figure 8A:
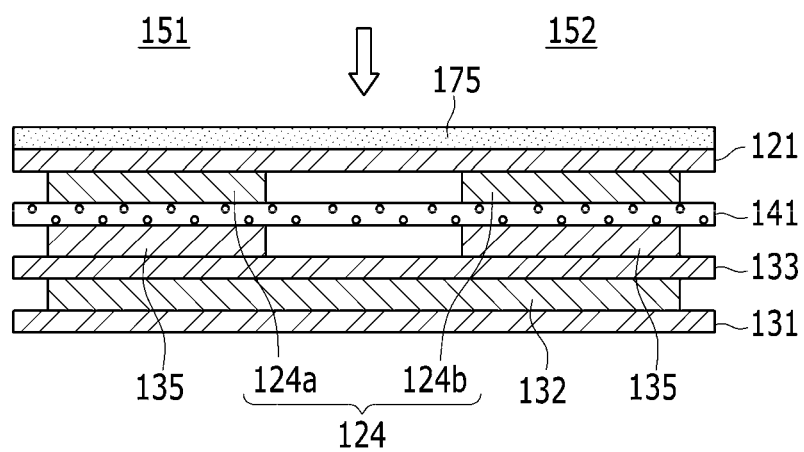
FIGS. 8A to 8C illustrate partial cross-sectional views of a flexible circuit board and a printed circuit board of a display device in a Comparative Example.
Figure 8B:
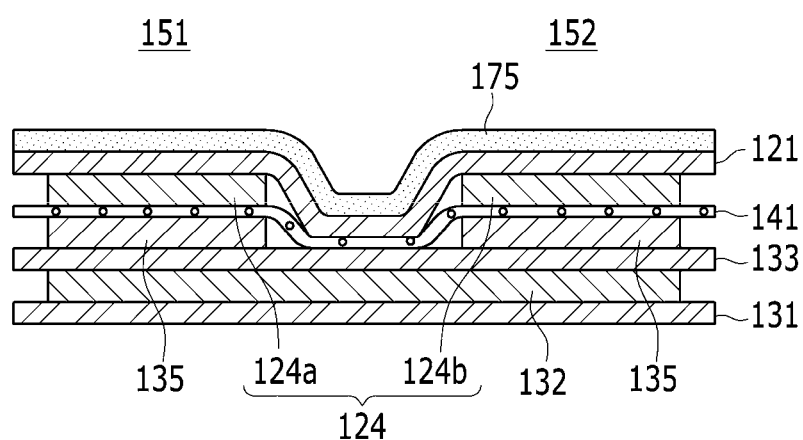
Figure 8C:
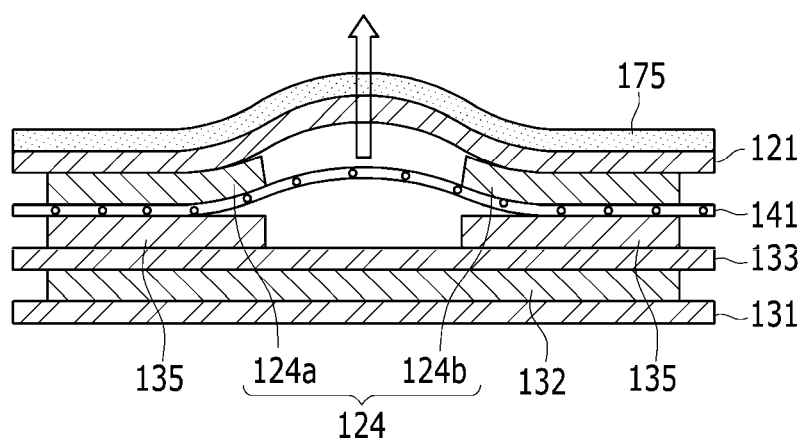

FIGS. 8A to 8C illustrate partial cross-sectional views of a flexible circuit board and a printed circuit board of a display device in a Comparative Example. The display device of the Comparative Example may not include the dummy layers of the first exemplary embodiment, and a solder resist layer 175 may be formed on the second side of the insulation film 121 corresponding to or overlying the input pad part 124.

Referring to FIGS. 8A to 8C, in the display device of the Comparative Example, there may be no difference in height between the portion corresponding to the first and second pad columns 151 and 152 and the portion corresponding to the space between the first and second pad columns 151 and 152. Accordingly, when the input pad part 124 of the flexible circuit board 120 is pressed by the hot pressing apparatus, the first anisotropic conductive film 141 and the insulation film 121 may be concavely pressed in the space between the first and second pad columns 151 and 152.

The first anisotropic conductive film 141 and the insulation film 121 (which are concavely pressed) may be subjected to a strong spring back effect after pressing, and a lifting defect upheaving in an opposite direction to a pressing direction may occur. For example, the first pad part 135 of the printed circuit board 130 and the input pads 124a and 124b of the flexible circuit board 120 may be separated from each other to generate a connection defect.

Figure 9:
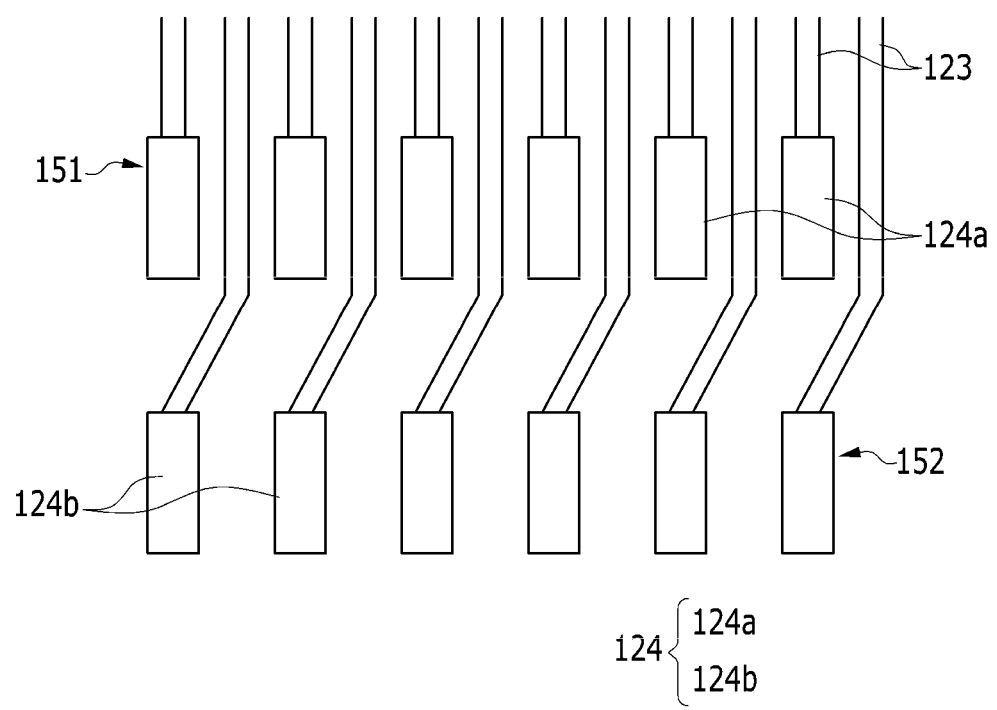
FIG. 9 illustrates a partial plan view of an input pad part of a flexible circuit board in a display device according to a second exemplary embodiment.
Figure 10:
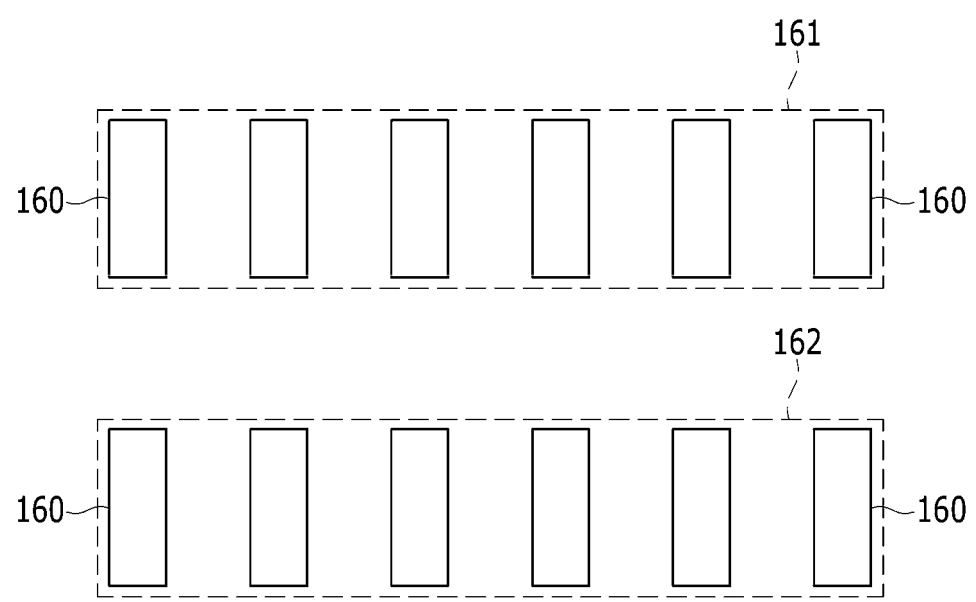
FIG. 10 illustrates a partial plan view of an opposite surface of the input pad part illustrated in FIG. 9.

FIG. 9 illustrates a partial plan view of an input pad part of a flexible circuit board in a display device according to a second exemplary embodiment. FIG. 10 illustrates a partial plan view of an opposite surface of the input pad part of FIG. 9. For example, FIG. 9 illustrates a first side of the insulation film, and FIG. 10 illustrates a second, e.g., opposite, side of the insulation film.

Referring to FIGS. 9 and 10, the input pad part 124 of the flexible circuit board may include a first pad column 151 and a second pad column 152 formed to be parallel or aligned with the first pad column 151 below or spaced apart from the first pad column 151. For example, edges of an input pad 124a of the first pad column 151 may be parallel with each other and may be aligned with edges of an adjacent input pad 124b of the second pad column 152.

The plurality of input pads 124a of the first pad column 151 may directly contact the corresponding input wiring 123. The plurality of input pads 124b of the second pad column 152 may also directly contact the corresponding input wiring 123. The input wiring 123 may be connected with the input pad 124b of the second pad column 152 and may include a curved or bent portion between the first pad column 151 and the second pad column 152.

A plurality of dummy layers 160 overlapping or aligned with the plurality of input pads 124a and 124b may be formed on the second side of the insulation film 121. The dummy layer 160 may be made of metal. A first solder resist layer 161 may be formed on the plurality of dummy layers 160 overlapping with the first pad column 151, and a second solder resist layer 162 may be formed on the plurality of dummy layers 160 overlapping with the second pad column 152.

The display device of the second exemplary embodiment may be formed by the same configuration and/or processes as the aforementioned first exemplary embodiment, except that the plurality of input pads 124a of the first pad column 151 and the plurality of input pads 124b of the second pad column 152 may be parallel or aligned with each other.

Figure 11:
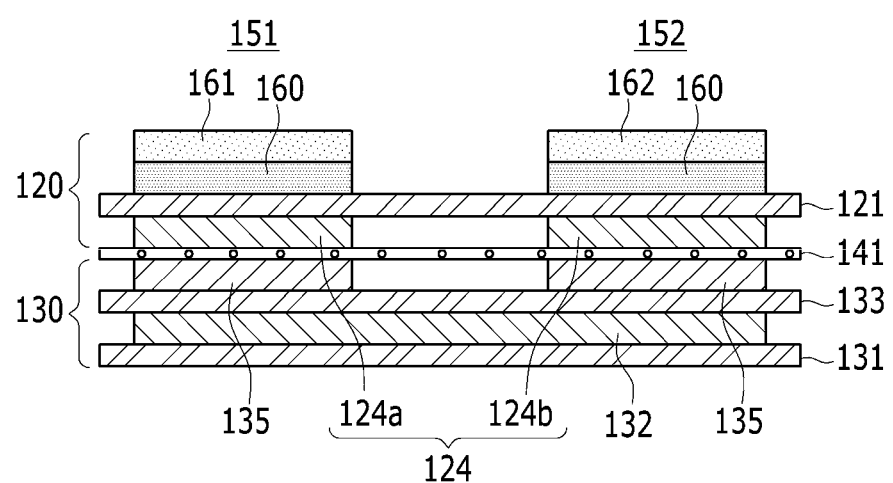
FIG. 11 illustrates a partial cross-sectional view of a flexible circuit board in a display device according to a third exemplary embodiment.

FIG. 11 illustrates a partial cross-sectional view of a flexible circuit board in a display device according to a third exemplary embodiment.

Referring to FIG. 11, in the display device of the third exemplary embodiment, a dummy layer 160 may be formed of a solder resist. In this case, the plurality of dummy layers 160 and the first and second solder resist layers 161 and 162 may be formed by coating the solder resist on the second side of the insulation film 121 two times. The display device of the third exemplary embodiment may be formed by the same configuration and/or processes as the aforementioned first exemplary embodiment or the second exemplary embodiment, except that the dummy layer 160 may be formed of a solder resist.

Figure 12:
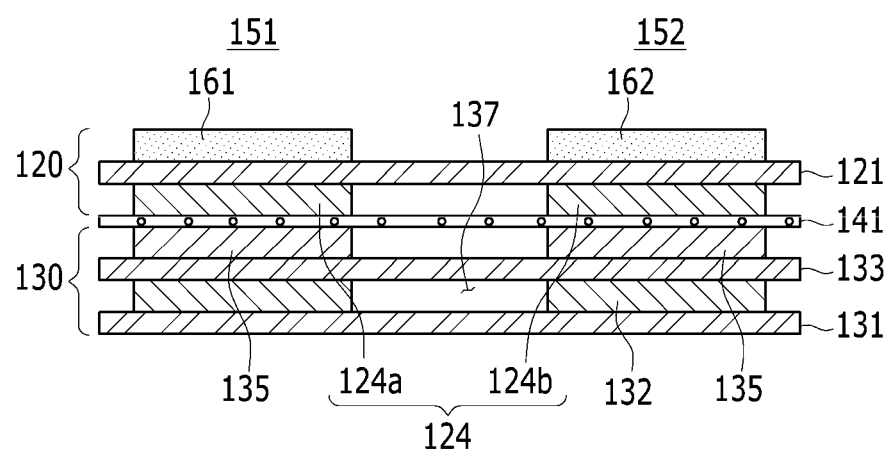
FIG. 12 illustrates a partial cross-sectional view of a flexible circuit board and a printed circuit board in a display device according to a fourth exemplary embodiment.

FIG. 12 illustrates a partial cross-sectional view of a flexible circuit board and a printed circuit board in a display device according to a fourth exemplary embodiment.

Referring to FIG. 12, in the display device of the fourth exemplary embodiment, a first metal layer 132 of the printed circuit board 130 forms a first opening 137 corresponding to, underlying, or aligned with a space between the first and second pad columns 151 and 152. For example, the first metal layer 132 may be patterned or otherwise formed such that a portion thereof is spaced apart from another portion thereof to provide the opening 137. The flexible circuit board 120 may not include a dummy layer of the first exemplary embodiment, and first and second solder resist layers 161 and 162 overlapping or aligned with first and second pad columns 151 and 152 may be formed on the second side of the insulation film 121 corresponding to the input pad part 124.

The first metal layer 132 may form the first opening 137 and, as a result, there may be no portion that firmly supports the first anisotropic conductive film 141 and the insulation film 121 from below in the space between the first and second pad columns 151 and 152. Accordingly, when the input pad part 124 of the flexible circuit board 120 is pressed by the hot pressing apparatus, the insulation film 121 and the first anisotropic conductive film 141 corresponding to or underlying the space between the first and second pad columns 151 and 152 may not be strongly pressed. Thus, deformation may be minimized.

As a result, the first anisotropic conductive film 141 and the flexible circuit board 120 may not be subjected to a spring back effect at the space between the first pad column 151 and the second pad column 152, and the display device of the fourth exemplary embodiment may help prevent a lifting defect of the flexible circuit board 120. The display device of the fourth exemplary embodiment may be formed by the same configuration and/or processes as the aforementioned first exemplary embodiment or second exemplary embodiment except that the dummy layer of the flexible circuit board 120 may be omitted and the first metal layer 132 may form the first opening 137.

Figure 13:
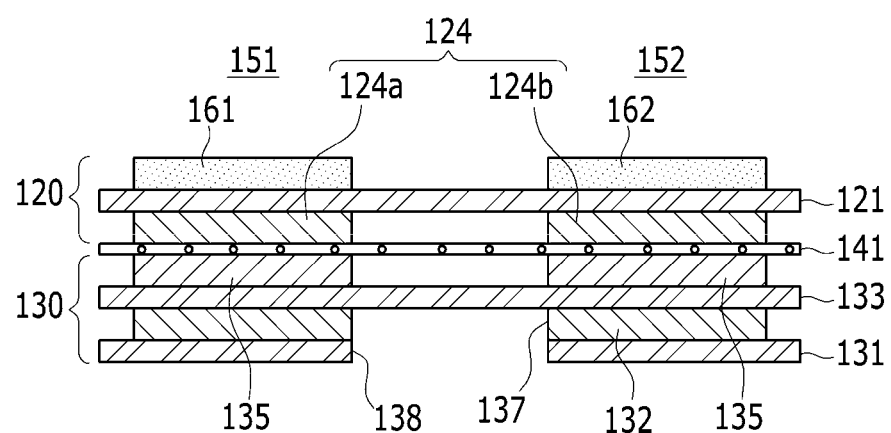
FIG. 13 illustrates a partial cross-sectional view of a flexible circuit board and a printed circuit board in a display device according to a fifth exemplary embodiment.

FIG. 13 illustrates a partial cross-sectional view of a flexible circuit board and a printed circuit board in a display device according to a fifth exemplary embodiment.

Referring to FIG. 13, the display device of the fifth exemplary embodiment may be formed by the same configuration and/or processes as the aforementioned fourth exemplary embodiment, except that a first film 131 of the printed circuit board 130 may form or provide a second opening 138 corresponding to, aligned with, or underlying a space between the first and second pad columns 151 and 152. In the fifth exemplary embodiment, both the first film 131 and the first metal layer 132 of the printed circuit board 130 together may form openings 137 and 138 corresponding to the space between the first and second pad columns 151 and 152.

As a result, a portion supporting the first anisotropic conductive film 141 and the insulation film 121 from below may be united with a second film 133 of the printed circuit board 130 in the space between the first and second pad columns 151 and 152. Accordingly, when the input pad part 124 of the flexible circuit board 120 is pressed by the hot pressing apparatus, a portion corresponding to the space between the first and second pad columns 151 and 152 in the insulation film 121 and the first anisotropic conductive film 141 may not be almost pressed and thus the deformation may be minimized.

By way of summation and review, as a resolution of the display panel increases, a greater number of wires and pads may be disposed on the flexible circuit board. In order to include a greater number of pads in a limited area, a pad part may have a structure in which pads are arranged in two lines.

In this case, the ACF and the flexible circuit board may be pressed by a step with the pad in a space between a pad in a first column and a pad in a second column to be subjected to a strong spring back effect. The spring back effect may act in an opposite direction to a pressing direction as restoring force. Accordingly, a defect in which a part of the flexible circuit board is lifted may occur, and a connection defect between the PCB and the flexible circuit board could be caused due to the defect.

The embodiments may provide a display device including a flexible circuit board and a printed circuit board.

The embodiments may provide a display device capable of preventing a connection defect between a printed circuit board and a flexible circuit board by suppressing a lifting defect of the flexible circuit board at a coupling portion of the printed circuit board and the flexible circuit board.

According to the exemplary embodiments, when an input pad part of the flexible circuit board is pressed by a hot pressing apparatus, the flexible circuit board may be selectively pressed only at a portion corresponding to first and second pad columns. Therefore, a first anisotropic conductive film and a flexible circuit board may not be subjected to a spring back effect at a space between a first pad column and a second pad column and may help prevent a lifting defect of the flexible circuit board.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
   a flexible circuit board including an insulation film, the insulation film including an input pad part and an output pad part on a first side thereof, the input pad part being laterally spaced apart from the output pad part on the insulation film;
   a printed circuit board including a first pad part, the first pad part facing and being connected to the input pad part; and
   a display panel including a second pad part, the second pad part facing and being connected to the output pad part,
   wherein:
     the input pad part includes a plurality of input pads that are arranged in at least two pad columns, and
     the flexible circuit board includes a plurality of dummy layers aligned with the plurality of input pads on a second side of the insulation film, the second side being an opposite side to the first side.

2. The display device as claimed in claim 1, wherein the plurality of dummy layers:
   overlaps with the plurality of input pads, respectively, and has the same size as the plurality of input pads.

3. The display device as claimed in claim 2, wherein the plurality of dummy layers is made of metal.

4. The display device as claimed in claim 2, wherein the plurality of dummy layers is made of a solder resist.

5. The display device as claimed in claim 1, wherein:
   the at least two pad columns include a first pad column and a second pad column, and
   the second pad column is aligned with the first pad column.

6. The display device as claimed in claim 1, wherein:
   the at least two pad columns include a first pad column and a second pad column, and
   the second pad column is offset relative to the first pad column at one side of the first pad column.

7. The display device as claimed in claim 6, wherein:
   in the first pad column, the plurality of input pads directly contacts a corresponding input wiring, and
   in the second pad column, the plurality of input pads is connected with the corresponding input wiring through a connection wiring on a second side of the insulation film.

8. The display device as claimed in claim 7, wherein dummy layers of the plurality of dummy layers that are aligned with the second pad column are integrally formed with the connection wiring.

9. The display device as claimed in claim 1, wherein:
   the at least two pad columns include a first pad column and a second pad column,
   dummy layers of the plurality of dummy layers that are aligned with the first pad column are covered by a first solder resist layer, and
   dummy layers of the plurality of dummy layers that are aligned with the second pad column are covered by a second solder resist layer.

10. A display device, comprising:
    a flexible circuit board including an insulation film, the insulation film including an input pad part and an output pad part on a first side thereof;
    a printed circuit board including a first film, a first metal layer, a second film, and a second metal layer sequentially laminated on the first film, the printed circuit board including a first pad part in which a part of the second metal layer is connected to the input pad part; and
    a display panel including a second pad part, the second pad part being connected to the output pad part,
    wherein:
      the input pad part includes a plurality of input pads that are arranged in at least two pad columns, and
      the first metal layer includes a first opening therein, the first opening being aligned with a space between the at least two pad columns such that the second film is between the first opening and the space between the at least two pad columns.

11. The display device as claimed in claim 10, wherein the first film includes a second opening therein, the second opening being aligned with a space between the at least two pad columns.

12. The display device as claimed in claim 10, wherein:
    the at least two pad columns include a first pad column and a second pad column, and
    the second pad column is aligned with the first pad column.

13. The display device as claimed in claim 10, wherein:
    the at least two pad columns include a first pad column and a second pad column, and
    the second pad column is offset relative to the first pad column at one side of the first pad column.

14. The display device as claimed in claim 10, wherein:
    the at least two pad columns include a first pad column and a second pad column, the flexible circuit board includes a first solder resist layer and a second solder resist layer on a second side of the insulation film, the second side being an opposite side to the first side, and the first solder resist layer and the second solder resist layer overlie the first pad column and the second pad column.

* * * * *